(12) United States Patent
Xu et al.

(10) Patent No.: US 10,403,200 B2
(45) Date of Patent: Sep. 3, 2019

(54) TRANSPARENT DISPLAY PANEL AND DISPLAY DEVICE

(71) Applicant: BOE TECHNOLOGY GROUP CO., LTD, Beijing (CN)

(72) Inventors: Xiaowei Xu, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 73 days.

(21) Appl. No.: 15/038,219

(22) PCT Filed: Dec. 10, 2015

(86) PCT No.: PCT/CN2015/096951
§ 371 (c)(1),
(2) Date: May 20, 2016

(87) PCT Pub. No.: WO2017/004938
PCT Pub. Date: Jan. 12, 2017

(65) Prior Publication Data
US 2017/0178566 A1    Jun. 22, 2017

(30) Foreign Application Priority Data

Jul. 3, 2015 (CN) .......................... 2015 1 0388997

(51) Int. Cl.
*H01L 27/32* (2006.01)
*H01L 51/00* (2006.01)
(Continued)

(52) U.S. Cl.
CPC ......... *G09G 3/3233* (2013.01); *H01L 27/326* (2013.01); *H01L 27/3262* (2013.01);
(Continued)

(58) Field of Classification Search
None
See application file for complete search history.

(56) References Cited

U.S. PATENT DOCUMENTS

2011/0272675 A1 * 11/2011 Chung ................ H01L 27/3246
257/40
2012/0044233 A1    2/2012 Hummel et al.
(Continued)

FOREIGN PATENT DOCUMENTS

CN    103440822 A    12/2013
CN    103681764 A     3/2014
(Continued)

OTHER PUBLICATIONS

The World Intellectual Property Organization (WIPO) International Search Report and Written Opinion for PCT/CN2015/096951 dated Mar. 17, 2016 8 Pages.
(Continued)

*Primary Examiner* — Amr A Awad
*Assistant Examiner* — Maheen I Javed
(74) *Attorney, Agent, or Firm* — Anova Law Group, PLLC

(57) ABSTRACT

In accordance with various embodiments of the disclosed subject matter, a transparent display panel and a related display device are provided. In some embodiments, a transparent display panel is provided, the transparent display panel comprises: a first region and a second region, wherein the first region comprises a plurality of first display units, the second region comprises a plurality of second display units, a transmission rate of the one of the plurality of first display units is higher than a transmission rate of the one of the plurality of second display units, and a luminance rate of the
(Continued)

10-01

10-02 one of the plurality of first display units is lower than a luminance rate of the one of the plurality of second display units.

16 Claims, 7 Drawing Sheets

(51) Int. Cl.
    *H01L 51/52* (2006.01)
    *G09G 3/3233* (2016.01)

(52) U.S. Cl.
    CPC ...... *H01L 51/0096* (2013.01); *H01L 51/5215* (2013.01); *H01L 51/5221* (2013.01); *G09G 2300/0439* (2013.01); *G09G 2300/0819* (2013.01); *G09G 2320/0233* (2013.01); *G09G 2320/045* (2013.01); *H01L 27/3216* (2013.01)

(56) References Cited

U.S. PATENT DOCUMENTS

| | | | |
|---|---|---|---|
| 2014/0183479 A1* | 7/2014 | Park | H01L 51/56 257/40 |
| 2014/0225078 A1 | 8/2014 | Jeung et al. | |
| 2014/0307430 A1 | 10/2014 | Lo et al. | |
| 2015/0028298 A1* | 1/2015 | Chung | H01L 51/5203 257/40 |
| 2015/0102305 A1 | 4/2015 | Jung et al. | |
| 2015/0357384 A1* | 12/2015 | Li | H01L 27/322 257/40 |
| 2016/0027850 A1* | 1/2016 | Lv | H01L 27/3218 257/40 |
| 2016/0141353 A1* | 5/2016 | Kim | H01L 27/326 257/773 |
| 2016/0190055 A1* | 6/2016 | Jinbo | H01L 27/3276 257/99 |
| 2016/0302717 A1* | 10/2016 | Tawa | G16H 15/00 |
| 2016/0329350 A1* | 11/2016 | Na | H01L 27/124 |

FOREIGN PATENT DOCUMENTS

| | | |
|---|---|---|
| CN | 103700692 A | 4/2014 |
| CN | 104347669 A | 2/2015 |
| CN | 105047687 A | 11/2015 |
| JP | 20100230797 A | 10/2010 |
| WO | 2017004938 A1 | 1/2017 |

OTHER PUBLICATIONS

State Intellectual Property Office of the P.R.C (SIPO) Office Action 1 for 201510388997.7 dated Jun. 30, 2017 13 Pages.
The European Patent Office (EPO) The Extended European Search Report for 15858120.7 Feb. 19, 2019 8 Pages.

* cited by examiner

TRANSPARENT DISPLAY PANEL AND DISPLAY DEVICE

CROSS-REFERENCES TO RELATED APPLICATIONS

This application is a national phase entry under 35 U.S.C. § 371 of International Application No. PCT/CN2015/096951, filed on Dec. 10, 2015, which claims priority to Chinese Patent Application No. 201510388997.7, filed on Jul. 3, 2015. The above enumerated patent applications are incorporated by reference herein in their entirety.

TECHNICAL FIELD

The disclosed subject matter generally relates to the display technologies and, more particularly, relates to a transparent display panel, and a related display device.

BACKGROUND

Along with the development of display technologies, transparent display devices can illustrate not only the displaying images from the front side of the transparent display screen, but also the objects behind the display device through the transparent display screen. Transparent display devices have been widely used in many products, such as refrigerators, vehicle windscreens, telescopes, and so on.

As illustrated in FIG. 1, a conventional Organic Light-Emitting Diode (OLED) transparent display panel includes multiple display units. Each display unit includes a light-emitting subunit and a light-transmitting subunit. As illustrated in FIG. 2, a light-emitting subunit of the transparent display panel can include a light-emitting device that is formed above transparent base substrate 1. The light-emitting device includes first electrode 11, second electrode 13, and emissive layer 12 that is between first electrode 11 and second electrode 13. The light-transmitting subunit usually does not contain a light-emitting device, but allow light to pass through. So the other side of the transparent display panel can be seen by a user through the multiple light-transmitting subunits. As a result, transparent display can be realized.

BRIEF SUMMARY

In accordance with some embodiments of the disclosed subject matter, a transparent display panel and a related display device are provided.

An aspect of the present disclosure provides a transparent display panel. In some embodiments, the transparent display panel comprises: a first region and a second region, wherein the first region comprises a plurality of first display units, the second region comprises a plurality of second display units, a transmission rate of the one of the plurality of first display units is higher than a transmission rate of the one of the plurality of second display units, and a luminance rate of the one of the plurality of first display units is lower than a luminance rate of the one of the plurality of second display units.

In some embodiments, the one of the plurality of first display units comprises a light-transmitting subunit and a light-emitting subunit, the transmission rate of the one of the plurality of first display units is a ratio of an area of the light-transmitting subunit and an area of the one of the plurality of first display units, and the luminance rate of the one of the plurality of first display units is a ratio of an area of the light-emitting subunit and an area of the one of the plurality of first display units.

In some embodiments, the area of the one of the plurality of first display units is equal to an area of the one of the plurality of second display units, the area of the light-transmitting subunit of the one of the plurality of first display units is larger than an area of a light-transmitting subunit of the one of the plurality of second display units, and the area of the light-emitting subunit of the one of the plurality of first display units is smaller than an area of a light-emitting subunit of the one of the plurality of second display units.

In some embodiments, the area of the one of the plurality of first display units is larger than the area of the one of the plurality of second display units.

In some embodiments, the first region is a round-shape region that is located in a center region of the transparent display panel, and the second region is a ring-shape region that surrounds the first region.

In some embodiments, the light-emitting subunit comprises a first portion of a transparent electrode, an opaque electrode, and an emissive layer between the transparent electrode and the opaque electrode, and the light-transmitting subunit comprises a second portion of the transparent electrode.

In some embodiments, the plurality of transparent electrodes of the plurality first display units are connected with each other, and the plurality of opaque electrodes of the plurality first display units are not connected with each other.

In some embodiments, the transparent electrode is an anode comprising an indium tin oxide layer and a silver layer, and the opaque electrode is a cathode made by a magnesium-silver alloy.

In some embodiments, the transparent electrode is a cathode made by silver, and the opaque electrode is an anode made by indium tin oxide.

In some embodiments, the one of the plurality of first display units comprises a first driving circuit, the second display unit comprises a second driving circuit, and an area of the first driving circuit is smaller than are area of the second driving circuit.

Another aspect of the present disclosure provides a display device, incorporating an disclosed transparent display panel.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a transparent display panel, and a related display device.

In some embodiments, the transparent display panel can comprise a first region and a second region. The first region comprises a plurality of first display units and the second region comprises a plurality of second display units. A transmission rate of the one of the plurality of first display units is higher than a transmission rate of the one of the plurality of second display units, and a luminance rate of the one of the plurality of first display units is lower than a luminance rate of the one of the plurality of second display units.

Figure 1:
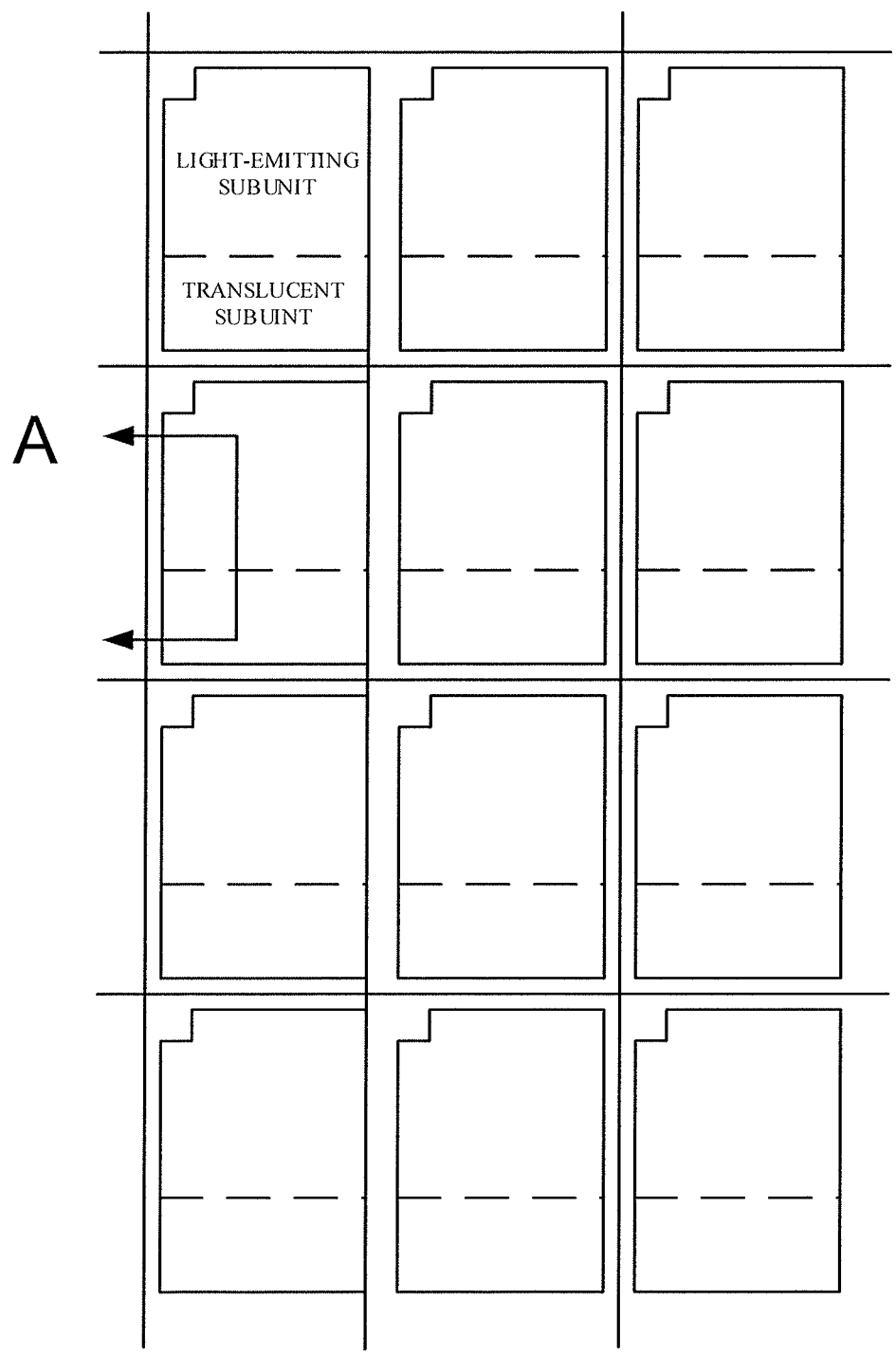
FIG. 1 is a schematic diagram of a conventional transparent display panel.
Figure 2:
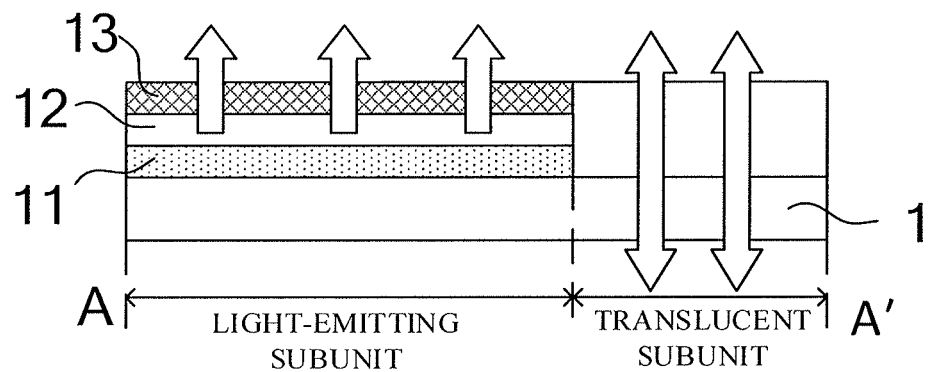
FIG. 2 is a schematic structural diagram of a display unit of the conventional transparent display panel shown in FIG. 1 in a sectional view of A-A' direction.
Figure 3:
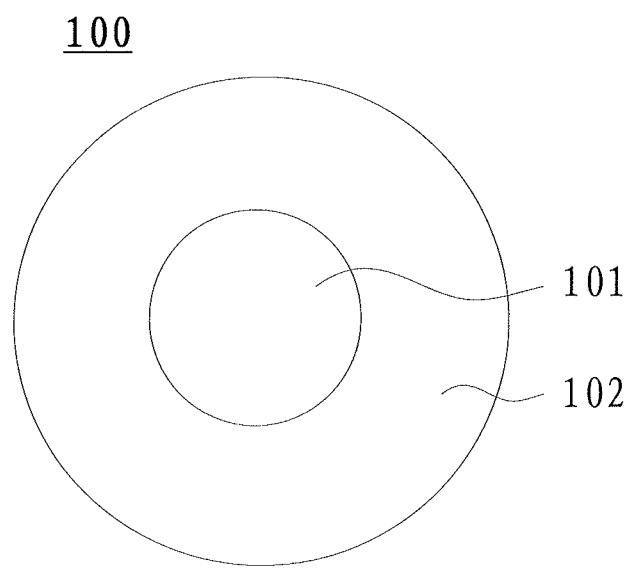
FIG. 3 is a schematic diagram of an exemplary transparent display panel in accordance with some embodiments of the disclosed subject matter.

In some embodiments, an exemplary transparent display panel 100 is shown in FIG. 3. As illustrated, transparent display panel 100 includes first region 101 and second region 102. In some embodiments, comparing to first region 101, second region 102 has a lower transmission rate but a higher luminance rate.

Transparent display panel 100 can include multiple gate lines and multiple data lines. The multiple gate lines and the multiple data lines crossover from each other and form multiple display units. A gate line and a corresponding data line can input control signals to a corresponding display unit to control the display function of the corresponding display unit. The area of a display unit is the area enclosed by gate lines and data lines of the adjacent display units.

Figure 4:
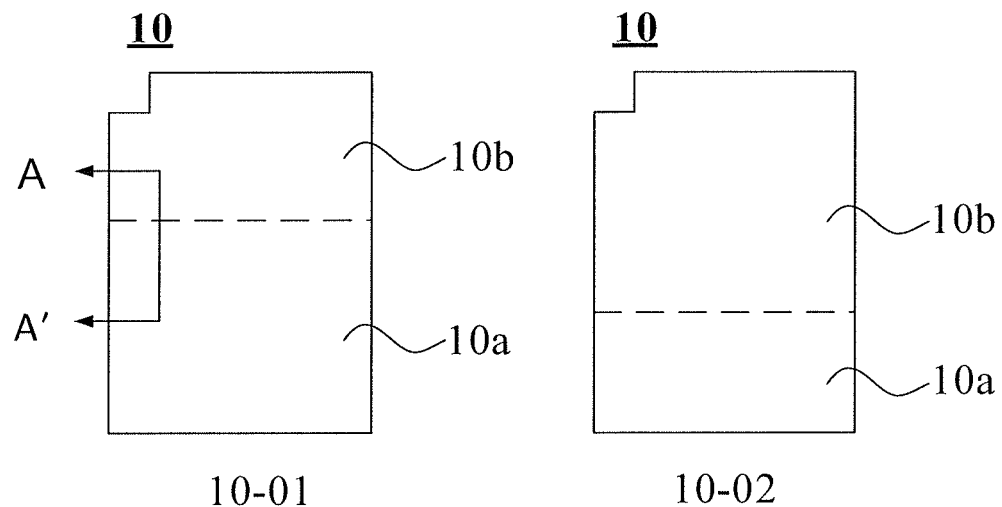
FIG. 4 is a schematic diagram of two exemplary display units of the exemplary transparent display panel shown in FIG. 3 in accordance with some embodiments of the disclosed subject matter.

Turning to FIG. 4, a schematic diagram of two exemplary display units 10 of transparent display panel 100 is shown in accordance with some embodiments of the disclosed subject matter. Display unit 10-01 is in first region 101 and display unit 10-02 is in second region 102.

Transparent display panel 100 includes multiple display units 10. Each display unit 10 can include a light-transmitting subunit 10a and a light-emitting subunit 10b. In some embodiments, a transmission rate of a display unit 10 is a ratio between the area of light-transmitting subunit 10a and the area of the display unit 10. And a luminance rate of a display unit 10 is a ratio between the area of light-emitting subunit 10b and the area of the display unit 10.

As illustrated in FIG. 4, a ratio between the area of light-transmitting subunit 10a of display unit 10-01 and the area of display unit 10-01 is larger than a ratio between the area of light-transmitting subunit 10a of display unit 10-02 and the area of display unit 10-02. Therefore, the transmission rate of display unit 10-01 is higher than the transmission rate of display unit 10-02. Compared with using second region 102, a user can more clearly see the other side of transparent display panel 100 through first region 101.

As illustrated in FIG. 4, a ratio between the area of light-emitting subunit 10b of display unit 10-01 and the area of display unit 10-01 is smaller than a ratio between the area of light-emitting subunit 10b of display unit 10-02 and the area of display unit 10-02. Therefore, the luminance rate of display unit 10-01 is lower than the luminance rate of display unit 10-02. Second region 102 can have a better displaying function than first region 101.

It should be noted that, multiple display units in first region 101 can have a same area, while multiple display units in second region 102 can have a same area.

In some embodiments, transparent display panel 100 can be used in any suitable field and can have any suitable shape. For example, as illustrated in FIG. 3, transparent display panel 100 can have a circular shape, and be used in a sighting telescope. In such an example, first region 101 can be a round-shape center region of the sighting telescope, which has a high transmission rate and can be more conducive to aim a target. Second region 102 can be a ring-shape surrounding region, which can be used to display aid information for aiming, such as target distance, wind speed, and any other suitable information. As another example, transparent display panel 100 can be used in smart glasses, refrigerator, vehicle front windshield, etc., and can have any suitable shape.

In some embodiments, as illustrated in FIG. 4, multiple display units 10 in first region 101 and second region 102 can have a same area. For display unit 10-01 in first region 101, the area of light-transmitting subunit 10a is larger than the area of light-emitting subunit 10b. For display unit 10-02 in second region 102, the area of light-transmitting subunit 10a is smaller than the area of light-emitting subunit 10b.

In some embodiments, the multiple display units 10 in first region 101 have a larger area than the multiple display units 10 in second region 102. So that a resolution of first region 101 is smaller than a resolution of second region 102. Second region 102 has a higher resolution, and can have a better displaying effect.

Figure 5:
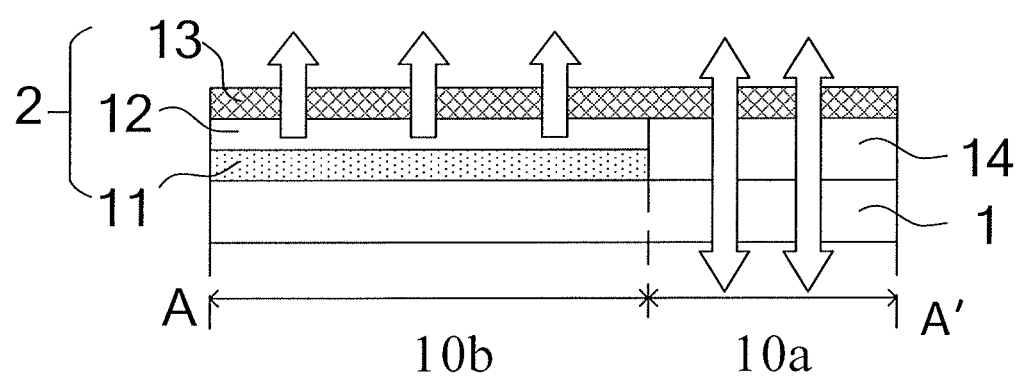
FIG. 5 is a schematic structural diagram of one exemplary display unit shown in FIG. 4 in a sectional view of A-A' direction in accordance with some embodiments of the disclosed subject matter.

Turning to FIG. 5, a schematic structural diagram of an exemplary display unit 10 is shown in a sectional view of A-A' direction of FIG. 4 in accordance with some embodiments of the disclosed subject matter.

As illustrated, display unit 10 can include light-transmitting subunit 10a and light-emitting subunit 10b. Both light-transmitting subunit 10a and light-emitting subunit 10b include transparent base substrate 1.

Light-emitting subunit 10b includes light-emitting device 2 that is formed above transparent base substrate 1. Light-emitting device 2 includes first electrode 11, a portion of second electrode 13, and emissive layer 12 that is between first electrode 11 and second electrode 13.

In some embodiments, first electrode 11 is an opaque electrode that is formed in light-emitting subunit 10b, wherein light-emitting subunit 10b can have display function on one side. For example, a first electrode can be a pixel electrode. Multiple first electrodes 11 included in the multiple display units 10 of transparent display panel 100 are disconnected with each other.

In some embodiments, second electrode 13 is a transparent electrode that is formed in both light-transmitting subunit 10*a* and light-emitting subunit 10*b*. Multiple second electrodes 13 included in the multiple display units 10 of transparent display panel 100 can connected with each other. Multiple second electrodes 13 can be formed by using any suitable method, such as deposition, coating, etc.

In some embodiments, first electrode 11 and second electrode 13 can be an anode and a cathode, respectively, wherein the cathode can provide electrons to emissive layer 12, and the anode can provide holes to emissive layer 12. The electrons and the holes can be composited in emissive layer 12 and excite emitting of emissive layer 12, thereby realized the display function.

In some embodiments, first electrode 11 can be an anode, while second electrode 13 can be a cathode. For example, first electrode 11 can be an anode that is formed by stacking one or more indium tin oxide (ITO) layers and one or more silver lays. As a particular example, first electrode 11 can be formed by stacking two ITO layer and one silver layer, wherein the silver layer is in between of the two ITO layer. Silver layer can improve the conductivity of the first electrode, and can also reflect the incident light to achieve a one-side display function of the display panel. Second electrode can be a cathode made of magnesium-silver alloy layer. The magnesium-silver alloy layer can be about 100 Å, and has a good conductivity and a high light transmission rate.

In some embodiments, first electrode 11 can be a cathode, while second electrode 13 can be an anode. For example, first electrode 11 can be a cathode made of silver. A silver layer can reflect incident light, and can provide electrons to emissive layer 12. Second electrode can be an anode made of ITO. The ITO layer can be a transparent layer, and can provide the holes to emissive layer 12. It should be noted that, multiple second electrodes 13 are disconnected with each other when they are anodes.

As illustrated in FIG. 5, light-transmitting subunit 10*a* can include transparent base substrate 1, second electrode 13, and transparent layer 14 that is between transparent base substrate 1 and second electrode 13. In some embodiments, in order to increase the transmission rate of light-transmitting subunit 10*a*, the transmission rate of transparent layer 14 can be chosen between the transmission rate of transparent base substrate 1 and the transmission rate of second electrode 13.

In some embodiments, display unit 10 can further comprise a driver circuit for driving light-emitting device 2 to emit light. In some embodiments, a driver circuit of display unit 10-01 in first region 101 has a smaller area compared to a driver circuit of display unit 10-02 in second region 102. In first region 101, display unit 10-01 has a small driver circuit and a small light-emitting subunit 10*b*, so the light-transmitting subunit 10*a* can have a larger area to increase the transmission rate. In second region 102, display unit 10-02 has a small light-transmitting subunit 10*a*, and a powerful driver circuit to drive a large light-emitting subunit 10*b*, so that the display effect of second region 102 can be enhanced.

Turning to FIGS. 6-9, schematic circuit diagrams of exemplary driving circuit are shown in accordance with some embodiments of the disclosed subject matter.

Figure 6:
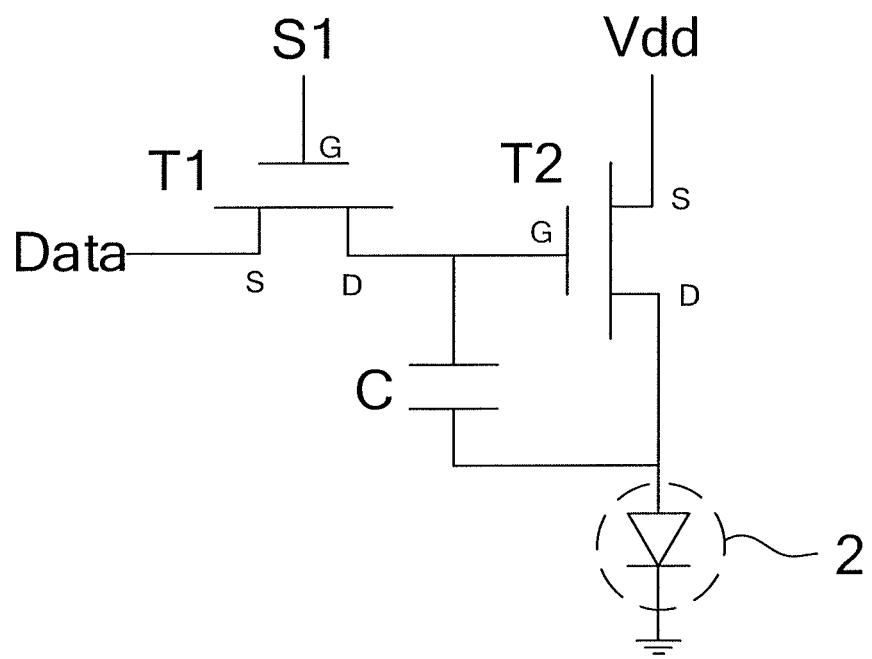
FIG. 6 is a schematic circuit diagram of an first exemplary driving circuit in accordance with some embodiments of the disclosed subject matter.

In some embodiments, a driver circuit of display unit 10-01 in first region 101 can be a 2T1C (two transistors and one capacitor) driver circuit shown in FIG. 6. The 2T1C driver circuit can include first transistor T1, second transistor T2 and capacitor C. In some embodiments, first transistor T1 can be a switching transistor, second transistor T2 can be a driving transistor.

As illustrated in FIG. 6, gate electrode G of first transistor T1 is connected with first gate line S1, source electrode S of first transistor T1 is connected with data line Data, drain electrode D of first transistor T1 is connected with gate electrode G of second transistor T2. Source electrode S of second transistor T2 is connected with Vdd line, drain electrode D of second transistor T2 is connected with first electrode of light-emitting device 2. Second electrode of light-emitting device 2 is grounded. One end of capacitor C is connected with gate electrode G of second transistor T2, the other end of capacitor C is connected with drain electrode D of second transistor T2.

In some embodiments, the configuration of a 2T1C driver circuit is very sensitive to the shift of threshold voltage of the driving transistor. A threshold voltage shift of the driving transistor can cause a great change of the current flow that goes through light-emitting device 2, resulting in an unstable light emission of the light-emitting device 2, and an uneven brightness.

Comparing to the 2T1C driver circuit, a 3T1C (three transistors and one capacitor) driver circuit or a 4T1C (four transistors and one capacitor) driver circuit can have better circuit configurations for driving light-emitting device 2 to achieve a better light emission effect. For example, a 3T1C driver circuit can compensate the threshold voltage of the driving transistor to ensure the stability of the current flow that goes through light-emitting device 2, and thereby ensure a more uniform brightness of light-emitting device 2. Therefore, in order to get a better display effect, second region 102 can use the 3T1C driver circuit structure or the 4T1C driver circuit structure.

Figure 7:
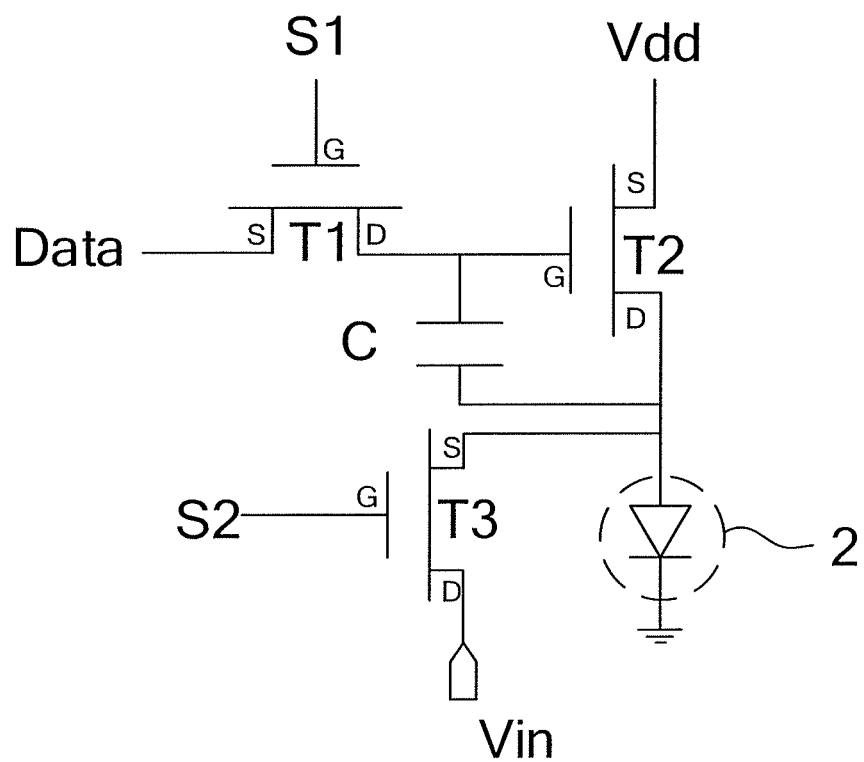
FIG. 7 is a schematic circuit diagram of an second exemplary driving circuit in accordance with some embodiments of the disclosed subject matter.

In some embodiments, a driver circuit of display unit 10-02 in first region 102 can be a 3T1C driver circuit shown in FIG. 7. The 3T1C driver circuit can include first transistor T1, second transistor T2, third transistor T3, and capacitor C.

As illustrated in FIG. 7, gate electrode G of first transistor T1 is connected with first gate line S1, source electrode S of first transistor T1 is connected with data line Data, drain electrode D of first transistor T1 is connected with gate electrode G of second transistor T2. Source electrode S of second transistor T2 is connected with Vdd line, drain electrode D of second transistor T2 is connected with first electrode of light-emitting device 2. Gate electrode G of third transistor T3 is connected with second gate line S2, source electrode S of third transistor T3 is connected with drain electrode D of second transistor T2, drain electrode D of third transistor T3 is connected with Vin line. Second electrode of light-emitting device 2 is grounded. One end of capacitor C is connected with gate electrode G of second transistor T2, the other end of capacitor C is connected with drain electrode D of second transistor T2.

Figure 8:
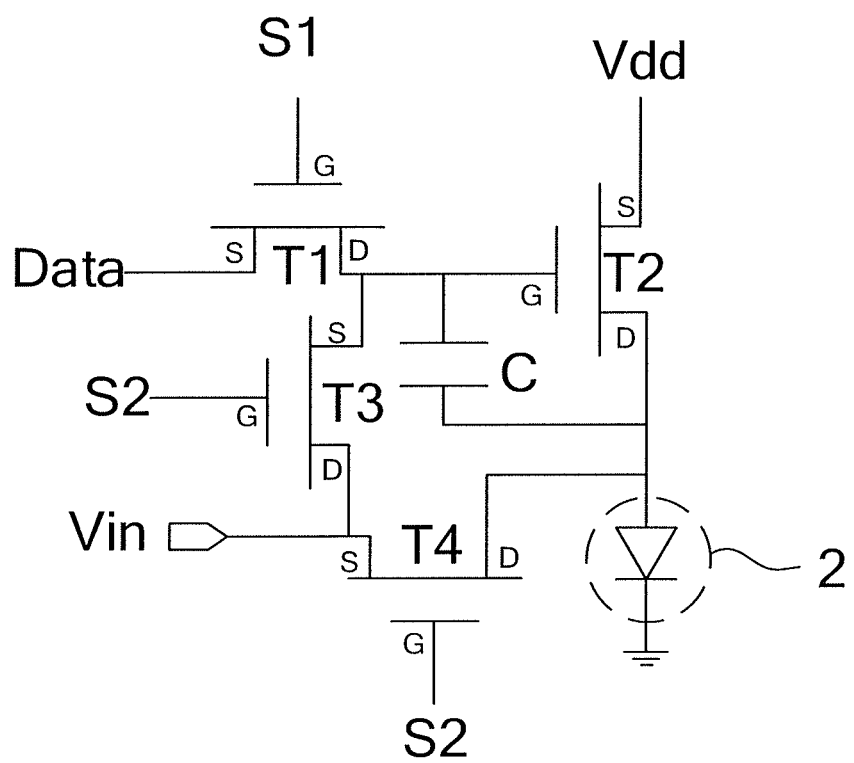
FIG. 8 is a schematic circuit diagram of an third exemplary driving circuit in accordance with some embodiments of the disclosed subject matter.
Figure 9:
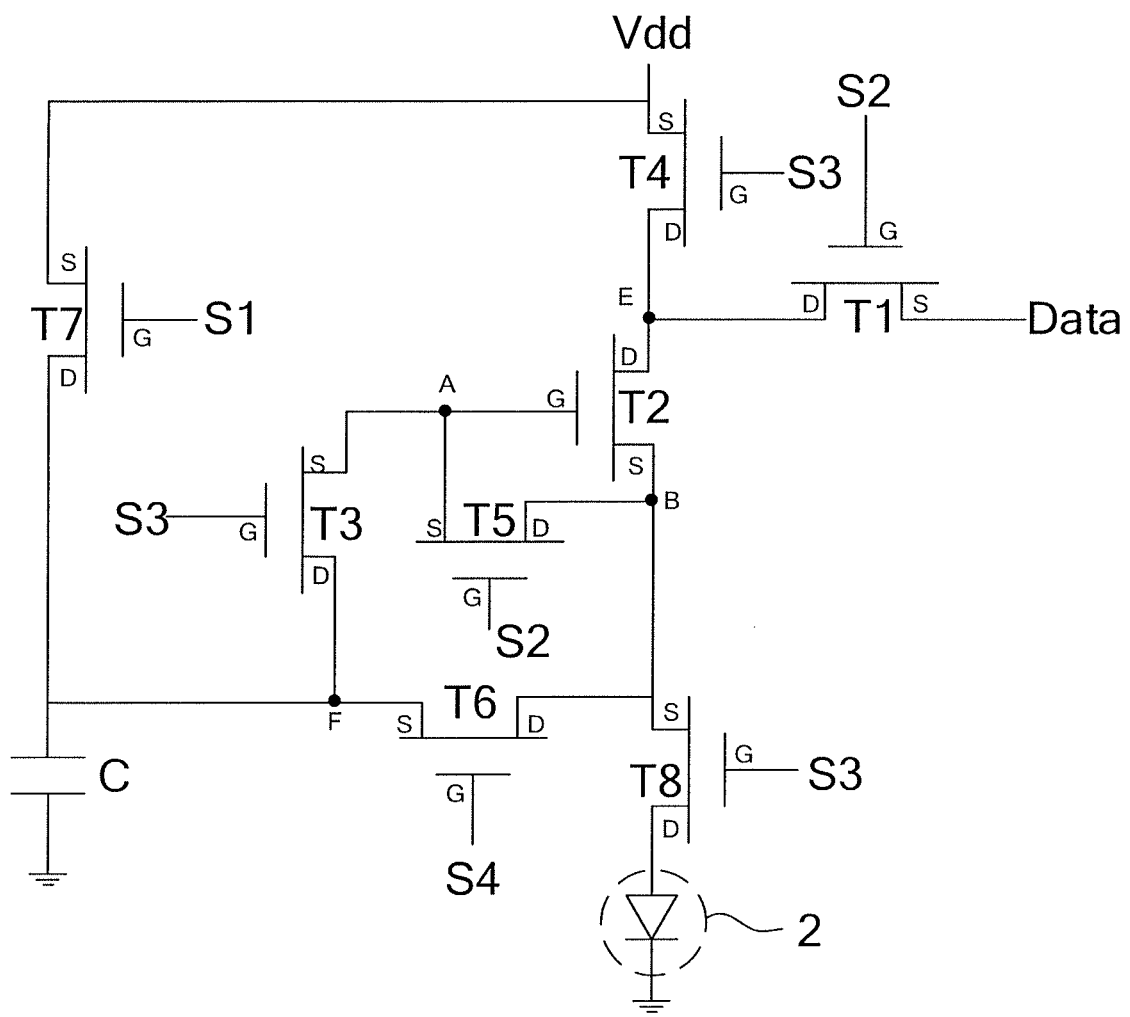
FIG. 9 is a schematic circuit diagram of an fourth exemplary driving circuit in accordance with some embodiments of the disclosed subject matter.

In some embodiments, a driver circuit of display unit 10-02 in first region 102 can be a 4T1C driver circuit shown in FIG. 8. The 4T1C driver circuit can include first transistor T1, second transistor T2, third transistor T3, fourth transistor T4, and capacitor C.

As illustrated in FIG. 8, gate electrode G of first transistor T1 is connected with first gate line S1, source electrode S of first transistor T1 is connected with data line Data, drain electrode D of first transistor T1 is connected with gate electrode G of second transistor T2. Source electrode S of second transistor T2 is connected with Vdd line, drain electrode D of second transistor T2 is connected with first electrode of light-emitting device 2. Gate electrode G of third transistor T3 is connected with second gate line S2, source electrode S of third transistor T3 is connected with drain electrode D of first transistor T2, drain electrode D of second transistor T3 is connected with Vin line. Gate electrode G of fourth transistor T4 is connected with second gate line S2, source electrode S of fourth transistor T4 is connected with Vin line, drain electrode D of fourth transistor T4 is connected with drain electrode D of second transistor T2. Second electrode of light-emitting device 2 is grounded. One end of capacitor C is connected with gate electrode G of second transistor T2, the other end of capacitor C is connected with drain electrode D of second transistor T2.

In some embodiments, a driver circuit of display unit 10-02 in first region 102 can have a more complicated structure. For example, a driver circuit of display unit 10-02 in first region 102 can be a 8T1C (eight transistors and one capacitor) driver circuit shown in FIG. 9. The 8T1C driver circuit can include first transistor T1, second transistor T2, third transistor T3, fourth transistor T4, fifth transistor T4, sixth transistor T6, seventh transistor T7, eighth transistor T8, and capacitor C.

As illustrated, gate electrode G of first transistor T1 is connected with second gate line S2, source electrode S of first transistor T1 is connected with data line Data, drain electrode D of first transistor T1 is connected with a node connecting drain electrode D of second transistor T2 and drain electrode D of fourth transistor T4 (refers to as fourth node E).

Gate electrode G of second transistor T2 is connected with a node connecting source electrode S of third transistor T3 and source electrode S of fifth transistor T5 (refers to as first node A), source electrode S of second transistor T2 is connected with a node connecting drain electrode D of fifth transistor T5 and source electrode S of eighth transistor T8 (refers to as second node B), drain electrode D of second transistor T2 is connected with fourth node E.

Gate electrode G of third transistor T3 is connected with third gate line S3, source electrode S of third transistor T3 is connected with first node A, drain electrode D of second transistor T3 is connected with a node connecting source electrode S of fourth transistor T4 and drain electrode D of seventh transistor T7 (refers to as third node F).

Gate electrode G of fourth transistor T4 is connected with third gate line S3, source electrode S of fourth transistor T4 is connected with Vdd line, drain electrode D of fourth transistor T4 is connected with fourth node E.

Gate electrode G of fifth transistor T5 is connected with second gate line S2, source electrode S of fifth transistor T5 is connected with first node A, drain electrode D of fifth transistor T5 is connected with second node B.

Gate electrode G of sixth transistor T6 is connected with fourth gate line S4, source electrode S of sixth transistor T6 is connected with third node F, drain electrode D of sixth transistor T6 is connected with second node B.

Gate electrode G of seventh transistor T7 is connected with first gate line S1, source electrode S of seventh transistor T7 is connected with Vdd line, drain electrode D of seventh transistor T7 is connected with third node F.

Gate electrode G of eighth transistor T8 is connected with third gate line S3, source electrode S of eighth transistor T8 is connected with second node B, drain electrode D of eighth transistor T8 is connected with first electrode of light-emitting device 2.

Second electrode of light-emitting device 2 is grounded.

One end of capacitor C is connected with third node F, the other end of capacitor C is grounded.

It should be noted that, the circuit configurations shown in FIGS. 6-9 only provide exemplary driver circuits in accordance with some embodiments of the disclosed subject matter. The driver circuit can be configured in any suitable way, but not be limited by the illustrated examples.

Additionally, the transistors used in the above examples can be any suitable transistors, such as thin film transistor, or any other device that has same characteristics. In some embodiments, the source electrode and the drain electrode in the transistor can be symmetrical, which means that the source electrode and the drain electrode may be configured interchangeable.

In accordance with some embodiments of the disclosed subject matter, a display device that comprises a transparent display panel described above can be provided. The display device can be any suitable device that has a display function, such as a mobile phone, a tablet computer, a television, a monitor, a notebook computer, a digital camera, a digital picture frame, a navigation system, etc.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a transparent display panel and a related display device are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A transparent display panel, comprising: a first region and a second region, wherein:
   the first region is a round-shaped region located in a center region of the transparent display panel, and the second region is a ring-shaped region surrounding the first region; and
   the first region comprises a plurality of first display units arranged in a first array including columns and rows, each of the plurality of first display units including a light-emitting subunit and a light-transmitting subunit, the light-transmitting subunit including:
   a transparent base substrate, a transparent layer in the light-transmitting subunit over the transparent base substrate and not extending to the light-emitting subunit, and
   an electrode over the transparent layer,
   wherein a transmission rate of the transparent layer is between a transmission rate of the transparent base substrate and a transmission rate of the electrode;
   the second region comprises a plurality of second display units arranged in a second array including columns and rows, not intermixing with the first array;

an overall transmission rate of the plurality of first display units is higher than an overall transmission rate of the plurality of second display units;

an overall luminance rate of the plurality of first display units is lower than an overall luminance rate of the plurality of second display units;

the overall transmission rate of the plurality of first display units is a ratio of areas of the light-transmitting subunits of the first display units to areas of the plurality of first display units; and the overall luminance rate of the plurality of first display units is a ratio of areas of the light-emitting subunits of the first display units to areas of the plurality of first display units.

2. The transparent display panel of claim 1, wherein: each of the plurality of second display units comprises a light-transmitting subunit and a light-emitting subunit;

the areas of the plurality of first display units are equal to areas of the plurality of second display units;

the areas of the light-transmitting subunits of the plurality of first display units are larger than areas of the light-transmitting subunit of the plurality of second display units; and the areas of the light-emitting subunits of the plurality of first display units are smaller than areas of the light-emitting subunit of the plurality of second display units.

3. The transparent display panel of claim 1, wherein the areas of the plurality of first display units are larger than the areas of the plurality of second display units.

4. The transparent display panel of claim 1, wherein: the light-emitting subunit comprises a first portion of a transparent electrode, an opaque electrode, and an emissive layer between the transparent electrode and the opaque electrode; and the electrode of the light-transmitting subunit comprises a second portion of the transparent electrode.

5. The transparent display panel of claim 4, wherein:
the transparent electrode is an anode comprising an indium tin oxide layer and a silver layer; and
the opaque electrode is a cathode made by a magnesium-silver alloy.

6. The transparent display panel of claim 4, wherein:
the transparent electrode is a cathode made by silver; and
the opaque electrode is an anode made by indium tin oxide.

7. The transparent display panel of claim 6, wherein:
the plurality of transparent electrodes of the plurality of first display units are connected with each other; and
the plurality of opaque electrodes of the plurality of first display units are disconnected with each other.

8. The transparent display panel of claim 1, wherein:
each of the plurality of first display units comprises a first driving circuit;
each of the plurality of second display units comprises a second driving circuit; and
an area of the first driving circuit is smaller than an area of the second driving circuit.

9. A display device, comprising: a transparent display panel that comprises a first region and a second region,
wherein: the first region is a round-shaped region located in a center region of the transparent display panel, and the second region is a ring-shaped region surrounding the first region;
the first region comprises a plurality of first display units arranged in a first array including columns and rows;

the second region comprises a plurality of second display units arranged in a second array including columns and rows, not intermixing the first array;

an overall transmission rate of the plurality of first display units is higher than an overall transmission rate of the plurality of second display units, an overall luminance rate of the plurality of first display units is lower than an overall luminance rate of the plurality of second display units, each of the plurality of first display units including a light-emitting subunit and a light-transmitting subunit, the light-transmitting subunit including:

a transparent base substrate, a transparent layer in the light-transmitting subunit being arranged over the transparent base substrate and not extending to the light-emitting subunit, and an electrode over the transparent layer, wherein: a transmission rate of the transparent layer is between a transmission rate of the transparent base substrate and a transmission rate of the electrode, wherein: the overall transmission rate of the plurality of first display units is a ratio of areas of the light-transmitting subunits of the plurality of first display units to areas of the plurality of first display units; and the overall luminance rate of the plurality of first display units is a ratio of areas of the light-emitting subunits of the plurality of first display units to areas of the plurality of first display units.

10. The display device of claim 9, wherein: each of the plurality of second display units comprises a light-transmitting subunit and a light-emitting subunit;

the areas of the plurality of first display units are equal to areas of the plurality of second display units; the areas of the light-transmitting subunits of the plurality of first display units are larger than areas of the light-transmitting subunits of the plurality of second display units; and the areas of the light-emitting subunits of the plurality of first display units are smaller than areas of the light-emitting subunits of the plurality of second display units.

11. The display device of claim 9, wherein the areas of the plurality of first display units are larger than the areas of the plurality of second display units.

12. The display device of claim 9, wherein: the light-emitting subunit comprises a first portion of a transparent electrode, an opaque electrode, and an emissive layer between the transparent electrode and the opaque electrode; and the electrode of the light-transmitting subunit comprises a second portion of the transparent electrode.

13. The display device of claim 12, wherein:
the transparent electrode is an anode comprising an indium tin oxide layer and a silver layer; and
the opaque electrode is a cathode made by a magnesium-silver alloy.

14. The display device of claim 12, wherein:
the transparent electrode is a cathode made by silver; and
the opaque electrode is an anode made by indium tin oxide.

15. The display device of claim 14, wherein:
the plurality of transparent electrodes of the plurality of first display units are connected with each other; and
the plurality of opaque electrodes of the plurality of first display units are disconnected with each other.

16. The display device of claim 9, wherein:
each of the plurality of first display units comprises a first driving circuit;

each of the plurality of second display units comprises a second driving circuit; and an area of the first driving circuit is smaller than an area of the second driving circuit.

* * * * *